United States Patent [19]
Kameya

[11] Patent Number: 5,389,902
[45] Date of Patent: Feb. 14, 1995

[54] ELECTROMAGNETIC DELAY LINE HAVING A PLURALITY OF CHIP CAPACITORS DISPOSED IN MORE THAN ONE ROW

[75] Inventor: Kazuo Kameya, Tokyo, Japan

[73] Assignee: Elmec Corporation, Kanagawa, Japan

[21] Appl. No.: 149,843

[22] Filed: Nov. 9, 1993

[30] Foreign Application Priority Data

Nov. 9, 1992 [JP] Japan .................... 4-322251

[51] Int. Cl.$^6$ .............................. H03H 7/32
[52] U.S. Cl. ......................... 333/138; 333/140
[58] Field of Search ................... 333/138–140, 333/156

[56] References Cited

U.S. PATENT DOCUMENTS

| | | | |
|---|---|---|---|
| 4,506,238 | 3/1985 | Endoh et al. | 333/140 X |
| 4,565,981 | 1/1986 | Kameya | 333/138 |
| 4,620,164 | 10/1986 | Kameya | 333/139 |
| 4,641,112 | 2/1987 | Kohayakawa | 333/140 |
| 4,649,356 | 3/1987 | Kameya | 333/138 |
| 4,961,060 | 10/1990 | Grandjean et al. | 333/138 X |

Primary Examiner—Seungsook Ham
Attorney, Agent, or Firm—Foley & Lardner

[57] ABSTRACT

The size of the electromagnetic delay line is reduced by arranging chip capacitors in two rows in a staggered relationship along the lengthwise direction of a base board so that the overall length can be substantially reduced as compared to the conventional structure in which the chip capacitors are arranged in a single row. In particular, the height of the profile of the package for the electromagnetic delay line can be substantially reduced as compared to the comparable conventional ones. Furthermore, this electromagnetic delay line can cover a wide range of delay time while maintaining a same size and configuration, and offers stable and desirable properties. The present invention also offers an electric advantage in that the bridging capacitance is produced while the parallel capacitance is reduced. This contributes to the improvement in the performance of the electromagnetic delay line.

12 Claims, 4 Drawing Sheets

ELECTROMAGNETIC DELAY LINE HAVING A PLURALITY OF CHIP CAPACITORS DISPOSED IN MORE THAN ONE ROW

TECHNICAL FIELD

The present invention relates to a lumped constant type electromagnetic delay line having an extremely small size, and in particular to such an electromagnetic delay line which can cover a wide range of delay time while retaining a same configuration and size.

BACKGROUND OF THE INVENTION

A conventional lumped constant type electromagnetic delay line typically comprises an inductive device consisting of a plurality of turns of electroconductive wire, and chip capacitors connected to a plurality of taps provided in the inductive device so as to form a ladder circuit consisting of a plurality of sections, typically ten sections. One of the important applications of the electromagnetic delay line of this type is the adjustment of a skew in the clock signal of computer systems, and an electromagnetic delay line for such an application is desired to be capable of delaying a pulse signal having a period in the order of the delay time of the electromagnetic delay line, in a stable manner. For instance, an electromagnetic delay line with a delay time of 20 ns is desired to be capable of delaying a pulse signal of 50 MHz in a stable manner.

However, in such an electromagnetic delay line, as the frequency of the pulse signal to be delayed approaches the cut-off frequency, the group delay property tends to change, and the delay time is affected accordingly. Therefore, an electromagnetic delay line consisting of ten sections may not be adequate for such an application, and is desired to be consisting of, for instance, 15 sections. Therefore, at least 14 chip capacitors are needed for such an electromagnetic delay line, and they have to be spaced apart to avoid mutual contacts. This obviously creates a serious difficulty in keeping the size of the electromagnetic delay line sufficiently small.

The inventor of this patent application previously proposed in U.S. Pat. No. 4,649,356 an electromagnetic delay line of this type featuring a small size and low manufacturing cost. According to this electromagnetic delay line, as illustrated in FIG. 4, a pair of first intermediate electrodes 3 and 5 serving as input and output electrodes and second intermediate electrodes 7 placed between the first intermediate electrodes 3 and 5 are all mounted on a major surface of a rectangular mounting plate 1 in mutually spaced relationship, and an inductive device 11 is formed by a plurality of turns of electroconductive wire wound around a bobbin 9 consisting of a rectangular plate. Two ends 11a and 11b and intermediate taps 11c of the inductive device 11 are soldered to the first intermediate electrodes 3 and 5 and the second intermediate electrodes 7, respectively, which are located along a long side of the rectangular mounting plate 1, and individually electrodes of a composite capacitor 13, consisting of an array of capacitors, are soldered to the intermediate electrodes 3, 5 and 7 on the major surface of the mounting plate 1.

The intermediate electrodes 3, 5 and 7 extend from the mentioned long side to the vicinity of the other long side of the mounting plate 1 on which a connecting electrode 15 is centrally formed. The composite capacitor 13 is connected to this connecting electrode 15 via a connecting piece 17, and input, output and common terminals 19, 21 and 23 are connected to the input, output and connecting electrodes 3, 5 and 15, respectively.

As illustrated in FIG. 5A, the composite capacitor 13 is provided with an elongated rectangular dielectric plate 13a, a common electrode 13b placed on one side (reverse side as seen in FIG. 5A) thereof substantially over the entire length thereof, and a plurality of individual electrodes 13c arranged on the other side of the dielectric plate 13a so as to correspond to the first intermediate electrodes 3 and 5 and the second electrodes 7. By soldering these individual electrodes 13c to the corresponding first and second intermediate electrodes 3, 5 and 7, a lumped constant type electromagnetic delay line is formed.

FIG. 5B illustrates the process for fabricating this composite capacitor. A ceramic dielectric plate of 25 mm square having a relative dielectric constant of 100 to 200 is polished to a thickness of 0.2 mm, and a layer of silver paste is applied over the entire surface of one side of this plate while a striped pattern of silver paste is deposited on the other side of this plate. It is then baked at approximately 800° C. The assembly thus prepared is cut into narrow strips perpendicularly to the direction of the stripes as indicated by the dotted lines in FIG. 5B.

The use of such a composite capacitor allows the pitch of the individual electrodes 13c to be in the order of 0.7 mm, and allows an electromagnetic delay line consisting of 15 sections to be formed by using a small mounting plate measuring 4.4 mm in width and 11 mm in length. This was a significant improvement over the previously known electromagnetic delay lines. Furthermore, the electromagnetic delay line illustrated in FIG. 4 may be encapsulated in a molded member, and, with its thickness no more than 2.5 mm, can be conveniently used with integrated circuits.

However, due to the ever growing demands for more compact design of computers and other electronic equipment, not only active components such as integrated circuits are desired to be reduced in size but also passive components such as resistors, capacitors and inductors are also desired to be further reduced in size.

Meanwhile, use of chip components adapted for the highly automated surface mounting technology has grown rapidly in recent years, and electromagnetic delay lines are also desired to be made available in the form of chip components. Additionally, it is desirable in view of design considerations that electromagnetic delays lines of a same package are capable of providing a wide range of delay time.

For instance, if an electromagnetic delay line having a structure such as that shown in FIG. 4 is made into a chip component by using a mounting plate measuring 4.4 mm in width and 11 mm in length, and is encapsulating in a molded package by transfer molding for instance by epoxy resin, its overall size will be 5.4 mm in width and 13 mm in length, which however is excessive in size for it to be conveniently used as a chip component.

Furthermore, this structure is useful only when the delay time is within a certain limit, for instance 15 ns when the characteristic impedance is 50 ohms. Therefore, achieving a delay time of 30 ns is highly difficult with this structure. To obtain such a large delay time, it is necessary to increase the capacitance of the capacitors, but in order to achieve such a large capacitance with the composite capacitor illustrated in FIG. 5, the ceramic dielectric plate typically having a relative dielectric constant of 200 has to be polished to a thickness in the order of 0.07 mm, and it is not practical to prevent the dielectric plate from being damaged during the fabricating process.

By using a dielectric plate made of a material having a large relative dielectric constant, the thickness of the dielectric plate can be increased to an acceptable level, but the relative dielectric constants of such materials are normally strongly affected by temperature, making them quite unsuitable for use as the capacitors for electromagnetic delay lines.

When a large delay time is not needed, it is possible to use a dielectric plate having the conventional thickness of 0.2 mm for the composite capacitor of the electromagnetic delay line of the type illustrated in FIG. 4. However, if the size of the electromagnetic delay line is required to be reduced, because the area of each of the individual electrodes 13c cannot be reduced, the gaps between the individual electrodes 13c must be reduced, and this causes an increase in the parasitic capacitance between the individual electrodes 13c which adversely affects the performance of the electromagnetic delay line.

FIG. 6 shows an equivalent circuit of the electromagnetic delay line for explaining this point. A plurality of inductances L are connected in series, and a plurality of capacitances C are connected thereto as a ladder circuit. Neighboring inductances L are coupled with each other by a mutual inductance M.

In such a circuit, a parallel capacitance Ca connected in parallel with each inductance L tends to degrade the delay property of the electromagnetic delay line, but a bridging capacitance Cb connected in parallel with each adjacent pair of inductances L improves the delay property of the electromagnetic delay line.

When the composite capacitor illustrated in FIG. 5 is used in the electromagnetic delay line of the type illustrated in FIG. 4, the parasitic capacitance between neighboring individual electrodes 13c correspond to the parallel capacitance Ca, but there is no source for producing, in any substantial amount, the bridging capacitance Cb which acts favorably toward the delay property of the electromagnetic delay line. Therefore, when the electromagnetic delay line of the type illustrated in FIG. 4 is fabricated as consisting of 15 sections, and its overall size is reduced, a satisfactory performance as an electromagnetic delay line cannot be attained.

BRIEF SUMMARY OF THE INVENTION

In view of such problems of the prior art, a primary object of the present invention is to provide an electromagnetic delay line which is compact in size but can cover a wide range of delay time with a same package.

A second object of the present invention is to provide an electromagnetic delay line which uses chip capacitors but is extremely compact in size.

A third object of the present invention is to provide an electromagnetic delay line which is reliable in operation, and can operate in a highly stable manner.

These and other objects of the present invention can be accomplished by providing an electromagnetic delay line comprising: a base board carrying a common electrode extending in a first direction and a plurality of connecting electrodes arranged along the first direction opposite to the common electrode; a plurality of chip capacitors arranged on the base board in two rows extending in the first direction between the common ground electrode and the connecting electrodes; means for connecting each of the chip capacitors across the common electrode and a corresponding one of the connecting electrodes; an inductive device having a plurality of taps connected to the connecting electrodes; whereby a ladder circuit is formed by the inductive device and the chip capacitors.

Thus, the electromagnetic delay line of the present invention can be fabricated as an extremely compact assembly, because the chip capacitors are arranged in two rows in a staggered relationship, and the overall length can be substantially reduced as compared to the conventional structure in which the chip capacitors are arranged in a single row. In particular, the height of the profile of the package for the electromagnetic delay line can be substantially reduced as compared to the comparable conventional electromagnetic delay lines.

The present invention also offers an electric advantage in that the bridging capacitance is produced while the parallel capacitance is reduced. This contributes to the improvement in the performance of the electromagnetic delay line.

The electromagnetic delay line of the present invention can cover a wide range of delay time while maintaining a same size and configuration, and offers stable and desirable properties. This feature is an important advantage in the designing of the electromagnetic line. The use of readily available chip capacitors instead of a special composite capacitor is important in terms of fabrication cost and reliability during use.

According to a preferred embodiment of the present invention, the inductive device is placed over the chip capacitors by being bent at the taps, and the inductive device is secured to the chip capacitors by bonding means. Thus, the inductive device is secured over a wide surface area, and not only the height of the package can be kept small by preventing the slanting of the inductive device, but also the inductive device can be secured in a more rigid manner.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
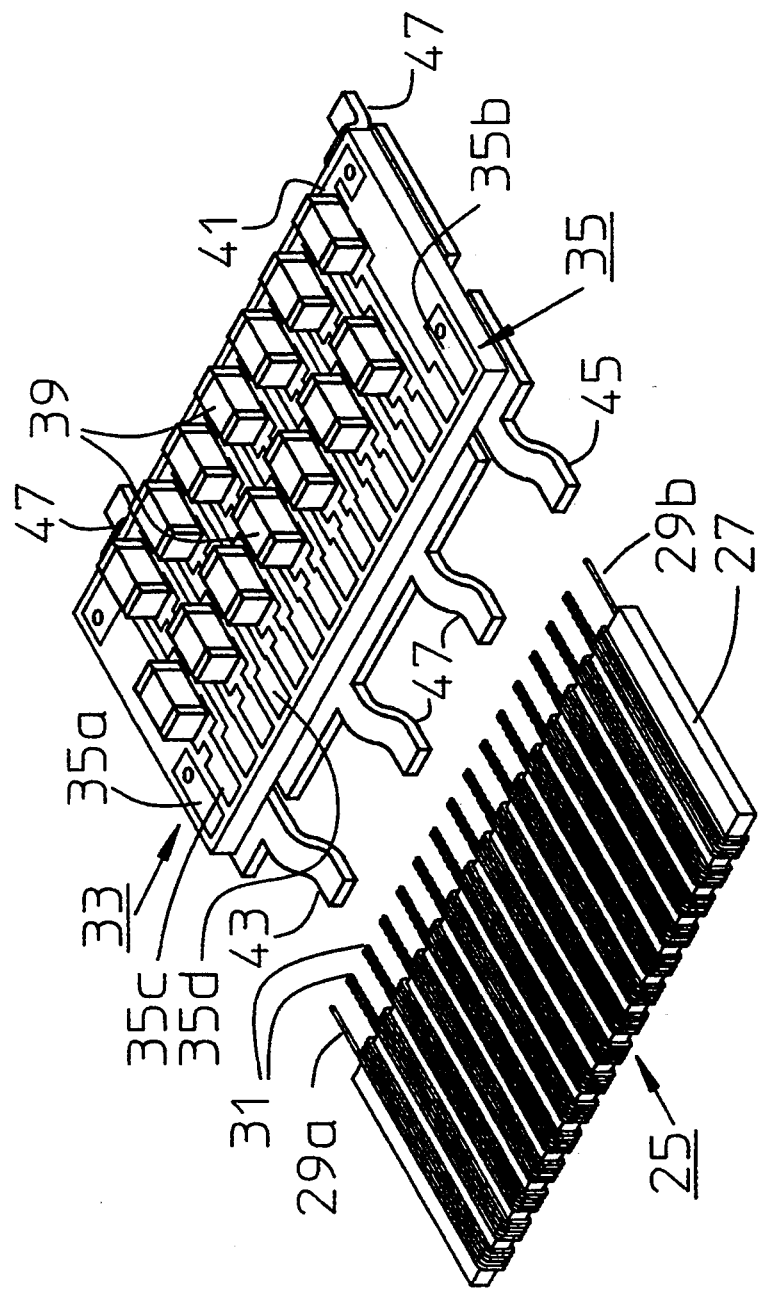
FIG. 1 is an exploded perspective view of a preferred embodiment of the electromagnetic delay line according to the present invention.
Figure 2:
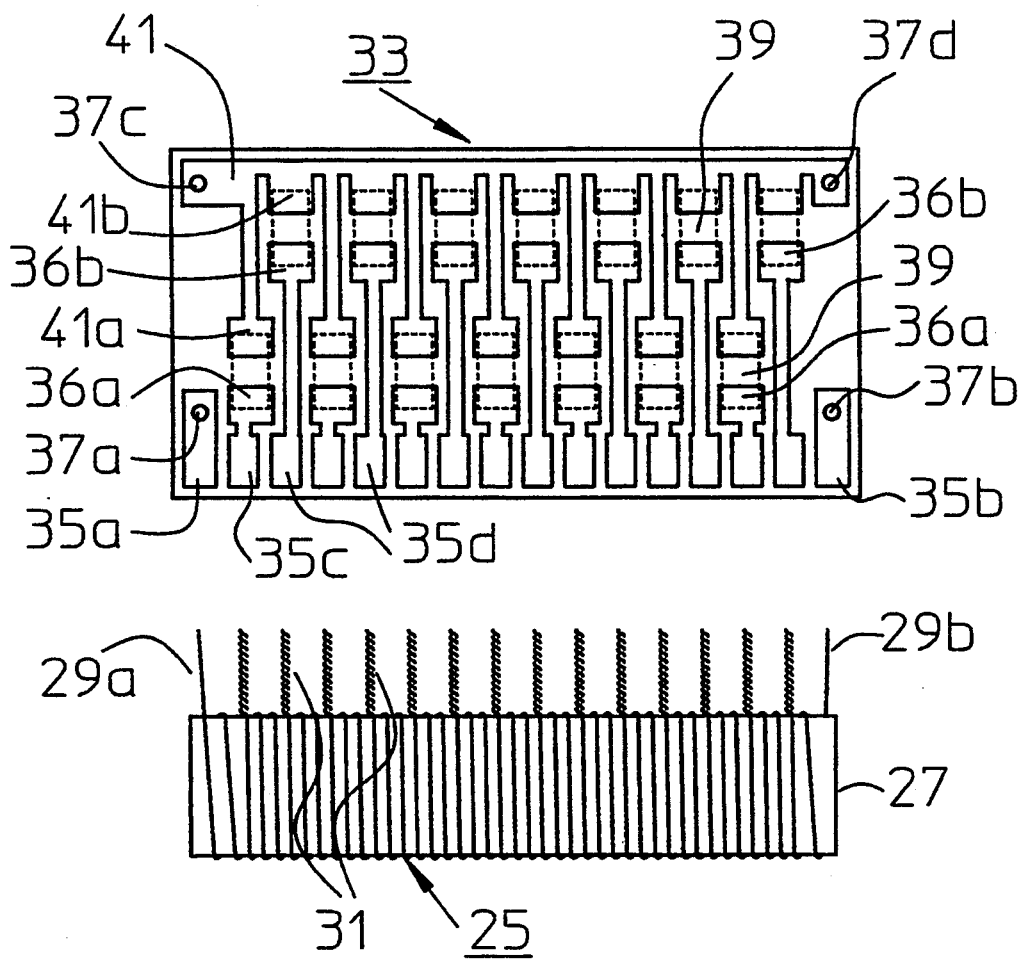
FIG. 2 is an exploded plan view of the electromagnetic delay line during the assembling process.

Referring to FIGS. 1 and 2, the inductive device 25 comprises a planar bobbin 27 having an elongated rectangular shape, made of an electrically insulating material, and a plurality of turns of electroconductive wire coated with an insulating layer is wound around the bobbin 27 in a single layer. A pair of leads 29a and 29b are provided at the two extreme ends of the coil wire, and a plurality of taps 31 are provided at intermediate points of the coil wire for each prescribed number of turns. These leads 29a and 29b and taps 31 extend sideways from a long side of the inductive device 25.

A rectangular base board 33 carries a number of connecting electrodes 35 along the edge of a long side on its upper surface (FIG. 1) so as to correspond to the leads 29a and 29b and the taps 31 of the inductive device 25. Preferably, the connecting electrodes 35 are arranged at the same pitch as the leads 29a and 29b and the taps 31. FIG. 1 shows the inductive device 25 in its still unconnected state for clarity.

The connecting electrodes 35a and 35b serve as input and output electrodes by being connected to the leads 29a and 29b, respectively, of the inductive device 25, and extend through the base board 33 by through holes 37a and 37b, respectively. The remaining connecting electrodes 35c and 35d between the electrodes 35a and 35b are connected to the leads 31.

The intermediate electrodes 35c and 35d extend inward by two different lengths in an alternating manner. More specifically, the intermediate electrodes 35d of one group extend deeper into the base board 33 than the intermediate electrodes 35c of the other group. The inner ends of these extensions are formed as rectangular connecting pads 36a and 36b as best illustrated in FIG. 2.

A common ground electrode 41 extends along the edge of the other long side of the base board 33, and is provided with a plurality of extensions extending inward into the base board 33 along its surface perpendicularly to the long side of the base board 33, again by two different lengths in an alternating manner. These extensions are each aligned with a corresponding one of the extensions of the intermediate electrodes 35c and 35d, and their inner ends are also formed as rectangular connecting pads 41a and 41b.

The lengths of these extensions from the intermediate electrodes 35c, 35d and 41 are determined in such a fashion that each opposing pair of connecting pads 36a and 41a, and 36b and 41b are spaced from each other by a same distance, and the longer extensions from the intermediate electrodes 35d and the common ground electrode 41 interdigitate with each other, as best illustrated in FIG. 2. As indicated by dotted lines, in the completed state of this electromagnetic delay line, a chip capacitor 39 is connected between each pair of the connecting pads 36a and 41a, and 36b and 41b which are spaced from each other by the said same distance.

Two longitudinal ends of the common ground electrode 41 are provided with electroconductive through holes 37c and 37d which extend through the base board 33, and reach the other side of the base board 33.

In the completed state of this electromagnetic delay line, a chip capacitor 39 is connected between each pair of the connecting pads 36a and 41a, and 36b and 41b which are spaced from each other by the said same distance as indicated by dotted lines in FIG. 2. Also, the leads 29a and 29b and the taps 31 are connected to the input electrode 35a, the output electrode 35b and the intermediate electrodes 35c and 35d in a corresponding manner. Thus, the electric structure of this electromagnetic delay line of a lumped constant type, consisting of the inductive device 25 and the chip capacitors 39 connected in the manner of a ladder, is completed. As can be readily seen from FIG. 2, the chip capacitors 39 are arranged in two rows along the lengthwise direction of the base board 33 in a staggered relationship.

After the leads and the taps of the inductive device 25 are soldered to the corresponding electrodes of the base board 33, the inductive device 25 is bent, at its taps, over the chip capacitors 39 with an epoxy resin pellet sheet interposed between them. The epoxy resin pellet sheet is then heated so that the inductive device 25 is fixedly secured to the chip capacitors 39. A lead frame is placed over the reverse surface of the base board via a layer of silver paste for bonding, and input and output terminal plates 43 and 45 and a ground terminal plate 47 which are eventually separated from the lead frame are bonded to the corresponding electrodes 35a, 35b and 41 via the corresponding through holes 37a, 37b, 37c and 37d.

Figure 3:
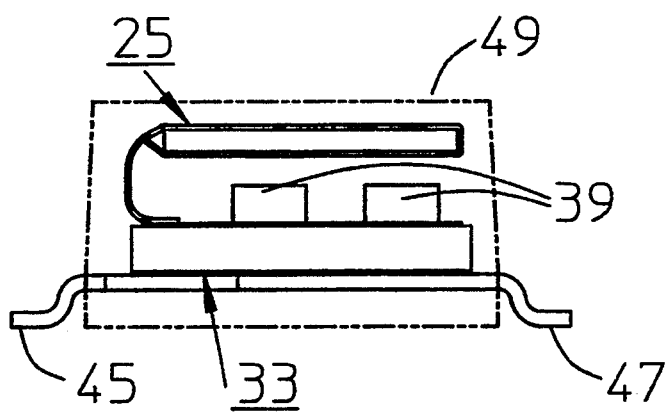
FIG. 3 is an end view of the electromagnetic delay line.
Figure 4:
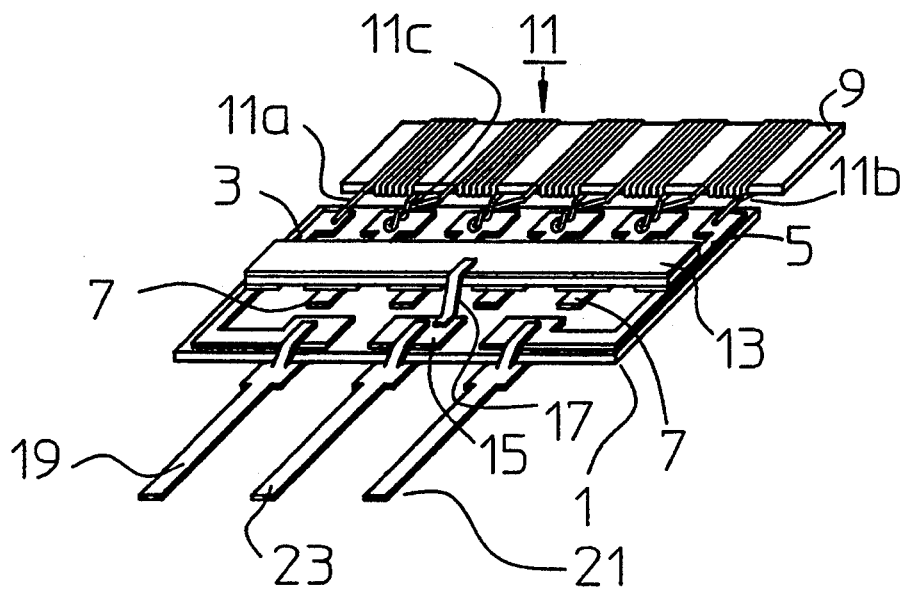
FIG. 4 is a conventional electromagnetic delay line.
Figure 5A:
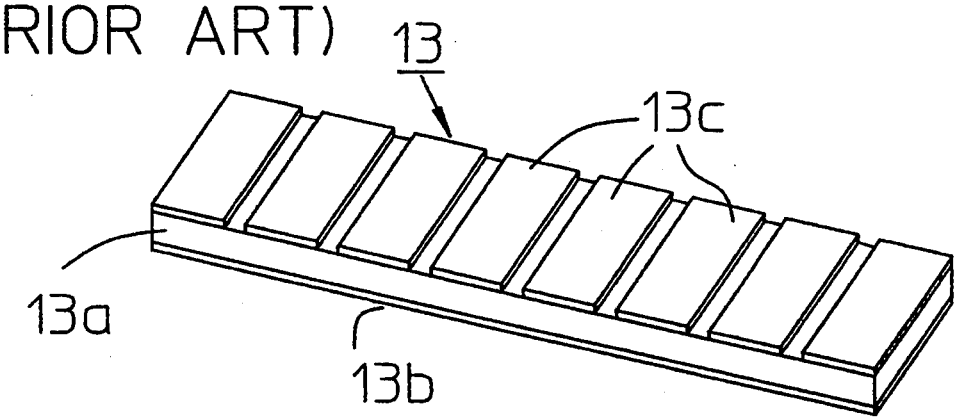
FIG. 5A is a perspective view showing a composite capacitor used in the conventional electromagnetic delay line.
Figure 5B:
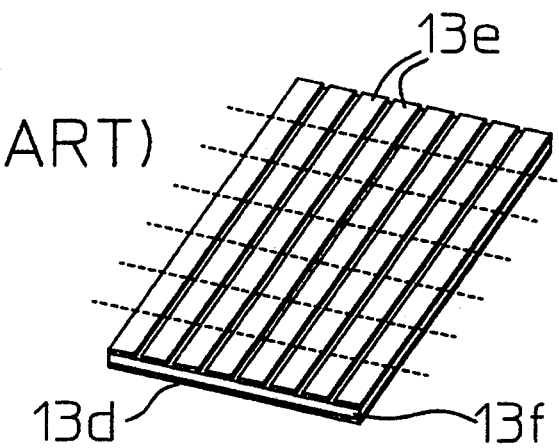
FIG. 5B is a perspective showing how this composite capacitor can be fabricated.

In the actual assembly process, after the chip capacitors 39 are soldered to the base board 33, the inductive device 25 is soldered to the corresponding electrodes. The base board 33 is then secured to the lead frame, and the entire assembly is subjected to a transfer molding process. By cutting apart the lead frame, the electromagnetic delay line is completed. Numeral 49 in FIG. 3 indicates a mold thus formed.

According to this structure, since the chip capacitors 39 are arranged in two rows in a highly compact manner without placing any two of the capacitors 39 excessively close to each other. In particular, this arrangement allows, for a given number of chip capacitors, the length of the entire assembly to be reduced.

If desired, the connecting pads 36b may be connected to the intermediate electrodes 35d via a printed circuit pattern placed on the reverse surface of the base board 33, or the connecting pads 41a may be connected to the common ground electrode 41 via a printed circuit pattern placed on the reverse surface of the base board 33. By doing so, the lateral pitch of the chip capacitors can be further reduced, and a larger number of chip capacitors may be mounted for a given size of the base board.

Figure 6:
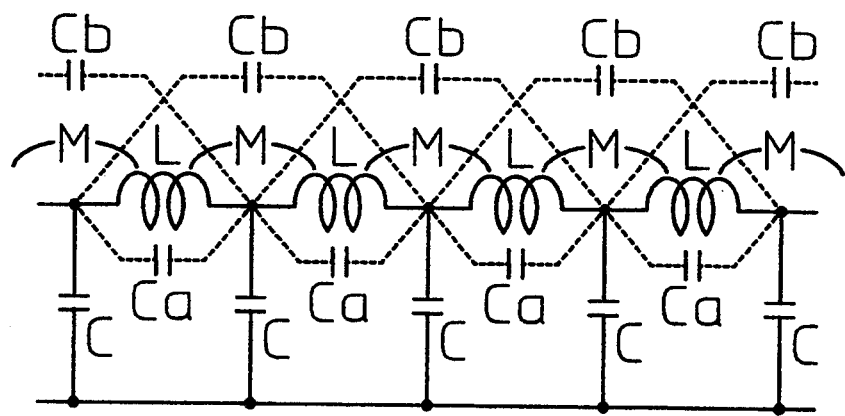
FIG. 6 is a circuit diagram showing an equivalent circuit of the electromagnetic delay line.

Also, because the leads of the neighboring capacitors as seen in the equivalent circuit of FIG. 6 are not so placed close to each other as those in the next but one positions, substantially no parallel capacitance is produced, and, instead, some bridging capacitance is produced.

Furthermore, the inductive device 25 is anchored to the chip capacitors 39 arranged in two rows instead of in a single row, and this increases the rigidity of the support structure for the inductive device 25 which is in turn improves the stability of the distributed capacitance between them, and hence stabilizes the delay property of the electromagnetic delay line in high speed regions.

If the inductive device 25 slants with respect to the base board 33, the overall thickness of the profile of the entire assembly increases accordingly. However, according to the above described structure, the inductive device 25 is mounted in parallel with the base board 33 in a more reliable fashion by being anchored by the chip capacitors 39 placed in a more widespread arrangement, and this ensures the uniformity in the low-profile finish of the produced electromagnetic delay line.

According to the experiments conducted by the inventor, an electroconductive wire coated with an insulating material having a diameter of 0.06 mm was wound around a planar bobbin which is 0.25 mm in thickness, 4 mm in width and 9 mm in length by 7 turns for each section, and 15 sections were provided with taps arranged at the pitch of 0.57 mm. The base board 33 was 9.3 mm long and 4.6 mm wide. Fourteen chip capacitors 39 each with the capacitance of 47 pF were soldered to the corresponding connecting pads 36a, 36b, 41a and 41b at the pitch of 0.55 mm. After the leads 29a and 29b and the taps 31 of the inductive device 25 were connected to the corresponding electrodes 35a, 35b, 35c and 35d, the inductive device 25 was placed over the chip capacitors 39. The thus obtained electromagnetic delay line had a characteristic impedance of 50 ohms, and the delay time of 30 ns.

This electromagnetic delay line consisting of 15 sections was molded by the transfer molding process and its final external dimensions were 10 mm in length, 5.6 mm is width, and 3 mm in height, which are substantially smaller than those of conventional equivalent electromagnetic delay lines-using chip capacitors.

According to the conventional structure in which chip capacitors are arranged in a single row along the lengthwise direction of the base board, a spacing of at least 1.1 mm was necessary between neighboring capacitors to avoid bridging of solder between them during the assembling process. When 14 chip capacitors are arranged in this fashion to form an electromagnetic delay line consisting of 15 sections, the length of the base board is required to be at least 18 mm long. Furthermore, according to such a structure, the delay property would be substantially degraded by the presence of the parallel capacitance Ca.

The above described embodiment was given only as an example and does not limit the scope of the present invention. For instance, the inductive device 25 is not required to be placed over the chip capacitors 39, and may extend laterally from the base board in its finally molded condition. Also, the molding process for the electromagnetic delay line according to the present invention is not limited by the above described embodiment. It is also possible to place the inductive device 25 directly over the chip capacitors 39, and mold the entire assembly in this condition, without using any epoxy resin pellet sheet or the like.

If an epoxy resin pellet sheet is used, it may have a controlled thickness and was mixed with dielectric ceramic powder so that this mixture when melted and filled into the gaps between the chip, capacitors may increase the bridging capacitance Cb.

If the delay time is desired to be increased, it can be accomplished for instance by increasing the width of the bobbin 27 of the inductive device 25.

The electromagnetic delay line according to the present invention may take various forms other than the surface mount type package described above. It can also provide various advantages when it is constructed as a SIP (single in-line package).

When testing the electromagnetic delay line of the present invention, it can be conveniently carried out before the lead frame is connected to the base board because the lead frame would short-circuit the entire assembly, if it is desired to be tested during the fabrication process.

Thus, according to the electromagnetic delay line of the present invention which can be fabricated as an extremely compact assembly, because the chip capacitors are arranged in two rows in a staggered relationship and connected to the inductive device as a ladder circuit via connecting electrode provided in the base board, the overall length can be substantially reduced as compared to the conventional structure in which the chip capacitors are arranged in a single row. In particular, the height of the profile of the package for the electromagnetic delay line can be substantially reduced as compared to the comparable conventional electromagnetic delay lines. The present invention also offers an electric advantage in that the bridging capacitance is produced while the parallel capacitance is reduced.

Thus, according to the present invention, there is provided an electromagnetic delay line by making use of chip capacitors which have conventionally been considered as unsuitable for such applications. Furthermore, the electromagnetic delay line of the present invention can cover a wide range of delay time while maintaining a same size and configuration, and offers stable and desirable properties.

Although the present invention has been described in terms of a specific embodiment thereof, it is possible to modify and alter details thereof without departing from the spirit of the present invention.

What I claim is:

1. An electromagnetic delay line comprising:
    a base board carrying a common ground electrode extending in a first direction and a plurality of connecting electrodes arranged along said first direction opposite to said common electrode;
    a plurality of chip capacitors arranged on said base board in a staggered relationship in two rows extending in said first direction between said common ground electrode and said connecting electrodes;
    means for connecting each of said chip capacitors across said common ground electrode and a corresponding one of said connecting electrodes;
    an inductive device having a plurality of taps connected to said connecting electrodes;
    whereby a ladder circuit is formed by said inductive device and said chip capacitors.

2. An electromagnetic delay line according to claim 1, wherein said inductive device is placed over said chip capacitors by being bent at said taps.

3. An electromagnetic delay line according to claim 2, wherein said inductive device is secured to said chip capacitors by bonding means.

4. An electromagnetic delay line according to claim 3, wherein said electromagnetic delay line is encapsulated in a molded member.

5. An electromagnetic delay line according to claim 3, wherein said electromagnetic delay line is embedded in a molded member.

6. An electromagnetic delay line, comprising:
    a base board having a first edge, and a second edge opposite to said first edge;
    a plurality of connecting electrodes arranged along said first edge thereof, said connecting electrodes being each provided with an extension extending away from said first edge toward said second edge, and terminating at an inner end thereof as a first connecting pad, said extensions being provided with two alternating lengths;
    a common ground electrode extending along said second edge, said common ground electrode being provided with extensions extending away from said second edge toward said first edge, each in alignment with a corresponding one of said extensions of said connecting electrodes, and each terminating at an inner end thereof as a second connecting pad, said extensions of said common ground electrode being provided with two alternating lengths so that longer ones of said extensions of said common ground electrode and said connecting electrodes interdigitate with each other, and each corresponding pair of said first and second connecting pads being spaced from each other by a prescribed distance;

an inductive device having taps each connected to a different one of said connecting electrodes; and chip capacitors each connected across one of said first connecting pads and an associated one of said second connecting pads so as to form a ladder circuit with respect to said inductive device.

7. An electromagnetic delay line according to claim 6, wherein said inductive device is placed over said chip capacitors by being bent at said taps.

8. An electromagnetic delay line according to claim 7, wherein said inductive device is secured to said chip capacitors by bonding means.

9. An electromagnetic delay line according to claim 8, wherein said electromagnetic delay line is encapsulated in a molded member.

10. An electromagnetic delay line according to claim 8, wherein said electromagnetic delay line is embedded in a molded member.

11. An electromagnetic delay line according to claim 1, wherein said base board has a top side and an under side, and said common ground electrode, said connecting electrodes, said chip capacitors, and said connecting means are all disposed on said top side of said base board.

12. An electromagnetic delay line according to claim 1, wherein said base board has a top side and an under side, and said common ground electrode, said connecting electrode, and said chip capacitors are all disposed on said top side of said base board, and said connecting means each comprises a printed circuit pattern on said under side.

* * * * *